United States Patent
Regner et al.

(10) Patent No.: US 6,766,736 B2
(45) Date of Patent: Jul. 27, 2004

(54) PRINTING STENCILS FOR ELECTRONIC SUBSTRATES

(75) Inventors: Richard Regner, Boise, ID (US); John Godfrey, Eagle, ID (US); Tony Teitenberg, Meridian, ID (US); Gary L. Chadwick, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 157 days.

(21) Appl. No.: 09/944,463

(22) Filed: Aug. 30, 2001

(65) Prior Publication Data

US 2003/0041753 A1 Mar. 6, 2003

(51) Int. Cl.[7] .............................................. B05C 17/06
(52) U.S. Cl. ...................... 101/127; 101/128.4; 101/129
(58) Field of Search ................................ 101/114, 127, 101/127.1, 128.4, 129

(56) References Cited

U.S. PATENT DOCUMENTS

| | | | |
|---|---|---|---|
| 4,776,271 A | 10/1988 | Schlipf et al. | |
| 4,835,704 A | 5/1989 | Eichelberger et al. | |
| 5,506,793 A | 4/1996 | Straayer et al. | |
| 5,759,269 A | 6/1998 | Cutting et al. | |
| 5,804,248 A * | 9/1998 | Hewett | 427/96 |
| 5,806,424 A * | 9/1998 | Elliot | 101/127.1 |
| 6,095,041 A * | 8/2000 | Comino et al. | 101/127 |
| 6,165,658 A | 12/2000 | Taff et al. | |
| 6,265,114 B1 * | 7/2001 | Ahn | 430/5 |
| 6,626,099 B1 * | 9/2003 | Amir | 101/129 |

* cited by examiner

Primary Examiner—Ren Yan
(74) Attorney, Agent, or Firm—Perkins Coie LLP

(57) ABSTRACT

Stencils are provided for more precisely aligning stencil orifices with terminals or "targets" on a substrate. One such stencil is adapted for registration with an electronic substrate, such as a PCB, about a locus. The stencil includes a stencil body and an array of printing orifices passing through the stencil body. The printing orifices may have varying sizes, with the size of each printing orifice being a function of a distance of the printing orifice from the locus. Various methods are also provided, including methods for applying solder on electronic substrates using stencils and methods and systems for designing such stencils.

80 Claims, 8 Drawing Sheets

PRINTING STENCILS FOR ELECTRONIC SUBSTRATES

TECHNICAL FIELD

The present invention generally relates to screen printing stencils. The invention has particular utility in depositing solder paste on terminals of a printed circuit board or other electronic substrate.

BACKGROUND

Microelectronic components can be mounted on printed circuit boards (PCBs) or other substrates in a variety of ways. Originally, most microelectronic components were provided with pins or leads which were passed through openings in the substrate then soldered in place. Increasingly, microelectronic components are being attached to substrates using surface mount technology. In this process, a terminal of the microelectronic component is attached to a terminal carried on a face of the substrate by a solder or the like. Typically, the solder will be applied to a terminal on the substrate as a paste. After the microelectronic component is positioned with its terminal in contact with the solder paste, the solder paste will be heated, causing it to reflow and electrically connect the two terminals.

Printed circuit boards and other microelectronic substrates are often manufactured in multi-step processes. The terminals are typically arranged on a face of the substrate in a predetermined array such that the individual terminals are in the locations where they are desired in the final end product. After the terminal array is initially formed on the substrate, the substrate may be subjected to a number of additional manufacturing steps. These subsequent manufacturing steps can induce dimensional changes in the substrate which alter the relative positions of the terminals in the initial terminal array, leading to a distorted terminal array in the final substrate.

For example, PCBs typically comprise multi-layer laminates, with selected layers bearing a subset of the complete electronic circuitry of the PCB. The layers are physically stacked on top of one another and laminated together. This laminating process frequently involves one or more steps in which the PCB is heated to elevated temperatures to bond the layers to one another. This thermal cycling and other handling of the PCB during manufacture will cause the PCB to change in shape, shifting the relative orientations of the terminals in the initially applied terminal array.

These shifts in position of the terminals on the substrates can cause significant manufacturing difficulties. Typically, the solder paste used to join the substrate terminals to terminals on the microelectronic components is applied in a screening process. In this process, a stencil is positioned over the terminal-bearing surface of the substrate, with the stencil being aligned with the substrate in a predetermined orientation. The orifices in the stencil are arranged in an array which matches each orifice to a terminal in the initial terminal array. Unfortunately, the growth or shrinkage of the substrate distorts the terminal array, so alignment of the orifices in the stencil with the corresponding terminals of the substrate can no longer be assured. Improper registry of the stencil orifice with the corresponding terminal on the substrate can lead to a faulty connection between the substrate and the microelectronic component mounted thereon. For more significant alterations in the substrate, solder paste intended for one terminal may bridge the gap between the intended terminal and another adjacent terminal, leading to a short circuit in the final product. After the solder paste is applied, the solder paste may be heated to cause it to "reflow" then allowed to cool, mechanically and electronically connecting the microelectronic component to the substrate.

SUMMARY OF THE INVENTION

The present invention provides stencils for use in screen printing and various related structures; methods for applying solder on electronic substrates using a stencil; and methods and devices for designing stencils for applying solder paste on electronic substrates. In accordance with one embodiment of the invention, a printing stencil is adapted for registration with an electronic substrate, such as a PCB, about a locus. The stencil includes a stencil body and an array of printing orifices passing through the stencil body. The printing orifices have varying sizes, with the size of each printing orifice being a function of a distance of the printing orifice from the locus. If so desired, the locus may be the center of the stencil body.

A stencil in accordance with another embodiment of the invention is adapted for applying solder to terminals of a terminal array carried by an electronic substrate. Such a stencil may include a stencil body having a center and an array of solder orifices passing through the stencil body. At least one central solder orifice of the array has a first size. Other solder orifices of the array can have a size different from the first size, with the increase or decrease in size being determined by a size scaling factor. In this embodiment, the size scaling factor for each such larger or smaller solder orifice is proportional to a distance of the solder orifice from the center of the stencil body.

Another embodiment of the invention provides a stencil adapted for registration with an electronic substrate, the substrate bearing an array of terminals, and the terminals in the array having an initial relative orientation in an initial terminal array. This stencil includes a stencil body and an array of printing orifices passing through a thickness of the stencil body. Each of the printing orifices in this particular embodiment is displaced by a predetermined offset from the center of the stencil body. For example, the offset for each printing orifice can be proportional to a distance of the orifice from the center.

Yet another embodiment of the invention provides a stencil in which both the size and the position of the printing orifices have been adjusted. The stencil of this embodiment includes a stencil body, a locus, and a plurality of printing orifices in the stencil body. The size of each printing orifice can be correlated to a first size by a size scaling factor. The position of each printing orifice can be displaced by a position-scaling factor from a position corresponding to a position of an associated terminal in the initial terminal array. The size scaling factor and the position-scaling factor for each printing orifice can both be proportional to a distance of the orifice from the locus.

A subassembly for manufacturing an electronic device in accordance with another embodiment of the invention includes an electronic substrate and a stencil. The electronic substrate has a first surface, a substrate locus, circuitry, and a plurality of terminals carried on the first surface and electrically coupled to the circuitry. The terminals have moved with respect to one another from an initial terminal array of target positions in which the targets had a first relative position to a stenciling array of target positions in which the targets have a second relative position. The stencil has a second surface, a stencil locus, and a plurality of solder orifices extending through a thickness of the stencil. Each of the solder orifices is displaced by a predetermined offset from a position corresponding to a position of an associated terminal in the initial terminal array. The offset for each solder orifice is proportional to a distance of the solder orifice from the stencil locus. The second surface of the stencil is juxtaposed with the first surface of the substrate and the stencil locus is registered with the substrate locus.

Other embodiments of the invention provide methods of screen printing which are well suited for applying solder paste on an electronic substrate using a stencil. In accordance with one such method, an electronic substrate is provided, with the electronic substrate including a substrate body and a plurality of terminals. The substrate body has circuitry, a first surface, and a substrate locus. The terminals are electrically coupled to the circuitry and are carried on the first surface in a predetermined relative relationship to define an initial terminal array. The substrate body is dimensionally altered such that the relative relationship of the terminals differs from the predetermined relative relationship. A stencil is also provided, with the stencil having a stencil body, a second surface, a stencil locus, and a plurality of solder orifices passing through the stencil body. Each solder orifice has a size correlated to an ideal size by a size scaling factor. The size scaling factor can be proportional to a distance from the stencil locus. If so desired, the position of each solder orifice may also be displaced by a position scaling factor from a position corresponding to a position of an associated terminal in the initial terminal array. Such a position-scaling factor may also be proportional to a distance from the stencil locus. The first surface of the electronic substrate and a second surface of the stencil are juxtaposed, with the stencil locus in registry with the substrate locus. The solder is passed through the solder orifices in the stencil to deposit a discrete volume of solder paste on each of the corresponding terminals.

Another embodiment of the invention provides a method for designing a stencil which may be used for applying solder paste on a plurality of like electronic substrate. In accordance with this method, the initial positions of a plurality of electrically conductive terminals are determined, with the terminals being arranged in an initial terminal array to be carried by the substrates. A size scaling factor and, if so desired, a position scaling constant for the initial terminal array may be estimated in light of anticipated handling of the substrates prior to solder deposition. A stencil locus of the stencil is identified. This stencil locus may be the center of the stencil or another point on the stencil. A plurality of solder orifices are arranged, with a separate solder orifice corresponding to each terminal. An initial solder orifice size is selected to deliver an appropriate volume of solder paste to an underlying terminal. Each solder orifice may then be sized by multiplying the initial solder orifice size by a size scaling factor proportional to the size scaling constant. The size scaling factor may be 1.0 adjacent the stencil locus and increase outwardly therefrom in proportion to a distance of the orifice from the stencil locus. In a further adaptation of this method, the positions of the solder orifices may also be adjusted by displacing each solder orifice from an ideal position by a predetermined offset correlated to the position scaling constant. The ideal position for each solder orifice may correspond to a position of the corresponding target in the initial target array. The position-scaling factor for each orifice can be proportional to a distance of the orifice from the stencil locus.

Another embodiment of the invention provides a computer readable storage medium containing a computer readable code for operating the computer to design a stencil as noted above. A further embodiment provides a system for designing a stencil, the system including a memory circuit, a computer readable storage medium containing program instructions for execution by a processor, and a processor connected the memory circuit and the computer readable storage medium, with the processor executing the program instructions stored on the computer readable medium to design a stencil.

DETAILED DESCRIPTION

Figure 1:
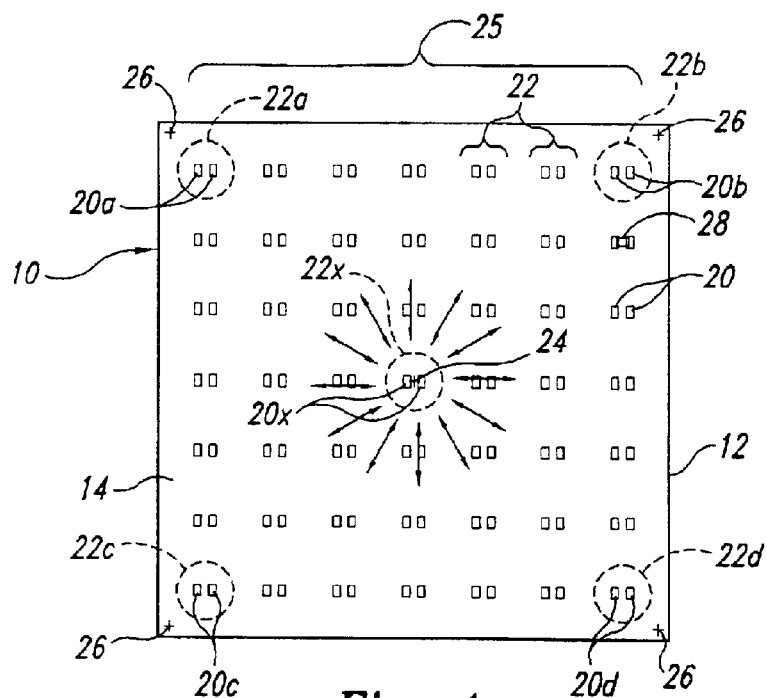
FIG. 1 is a top view of a conventional electronic substrate.

Various embodiments of the present invention provide stencils for use in screen printing, subassemblies for manufacturing electronic devices, methods for applying solder on electronic substrates using stencils, and methods for designing stencils for applying solder paste on electronic substrates. The following description provides specific details of certain embodiments of the invention illustrated in the drawings to provide a thorough understanding of those embodiments. It should be recognized, however, that the present invention can be reflected in additional embodiments and the invention may be practiced without some of the details in the following description.

FIG. 1 illustrates a conventional microelectronic substrate 10, which may be a printed circuit board or a flexible membrane substrate, for example. This substrate 10 includes a body 12 and a terminal-bearing surface 14. A plurality of terminals 20 are arranged on the terminal-bearing surface 14 in a terminal array 25 and connected to circuitry 29 carried by the substrate 10, as shown systematically in FIG. 3. The arrangement of the terminals 20 within the terminal array 25 depends on the intended use of the substrate 10. In the design shown in FIG. 1, the terminals 20 are arranged in a plurality of terminal pairs 22, each of which pairs is adapted to be electrically coupled to terminals (not shown) of a microelectronic component 28. (For purposes of clarity, only one microelectronic component 28 is shown, but it should be understood that each terminal pair 22 may be adapted to support a separate microelectronic component 28.)

The terminal pairs 22 illustrated in FIG. 1 are arranged in a regular array on the terminal-bearing surface 14, i.e., each of the pairs 22 is equidistant from the next adjacent pair 22. Such a regular array may be used when manufacturing a single large substrate 10 which may be populated with microelectronic components 28 then divided or "singulated" into a plurality of smaller component-bearing substrates. In other applications, the terminal pairs 22 may be arranged in an irregular pattern on the terminal-bearing surface 14. Although FIG. 1 shows each of the terminals 20 as having the same size, in some applications the sizes of the terminals 20 may vary to accommodate different microelectronic components 28 at different locations on the substrate 10.

The substrate 10 has a substrate locus 24, which may be thought of as the location on the substrate 10 with respect to which a stencil 40 is aligned. Stencils 40 are typically brought into registration with substrates 10 using automated optical imaging equipment. For example, the equipment may scan an image of the substrate 10 and determine the position and orientation of the substrate 10 by identifying the edges of the substrate 10. To facilitate identification of the substrate locus 24 by such automated equipment, one or more fiducials 26 may be carried by the terminal-bearing surface 14 of the substrate 10. These fiducials may be marks, such as the plus signs shown in FIG. 1, which are more readily identified by the imaging equipment for determining the position of the substrate locus 24.

The position of the substrate locus 24 may vary depending upon the application. In FIG. 1, the substrate locus 24 is located at the center of the substrate 10. This location can be easily determined in the illustrated substrate 10 because it is equidistant from the opposite edges of the substrate 10. If fiducials 26 are positioned adjacent the corners of the terminal-bearing surface 14, as shown, the substrate locus 24 may be determined as the point which is equidistant from each of these fiducials.

Figure 2:
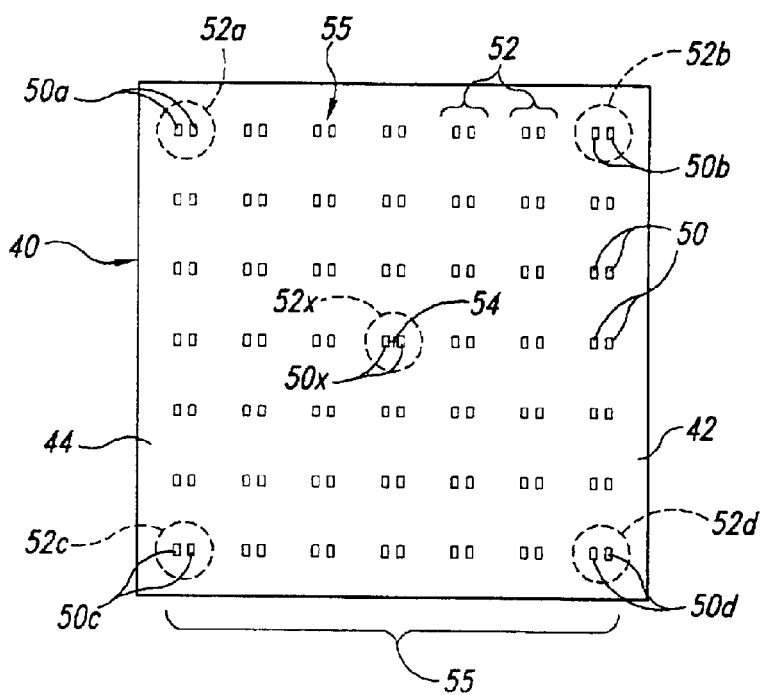
FIG. 2 is a top view of a conventional screen-printing stencil adapted to deposit solder paste on the PCB of FIG. 1.
Figure 3:
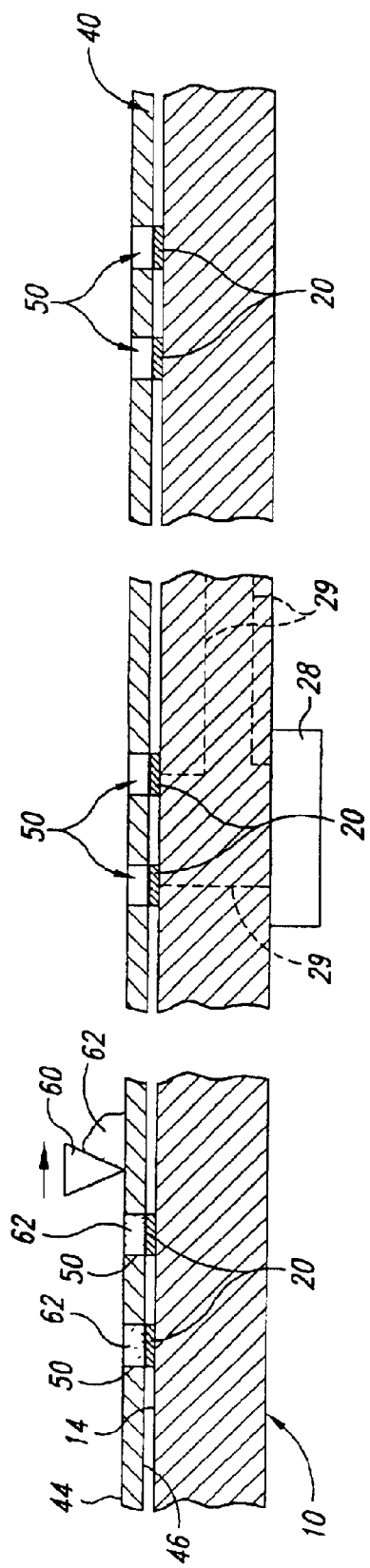
FIG. 3 is a schematic cross sectional view of a screen printing process employing the stencil of FIG. 2 to deposit solder paste on the substrate of FIG. 1.

FIG. 2 illustrates a conventional stencil 40 of the type commonly used to deposit solder paste or the like on electronic substrates. The stencil 40 includes a stencil body 42, an upper surface 44 and a facing surface 46 (not shown in FIG. 2). As shown in FIG. 3, the facing surface 46 is adapted to be juxtaposed with the terminal-bearing surface 14 of the substrate 10 during a screen printing process.

The stencil 40 includes a plurality of orifices 50 arranged in an orifice array 55. The orifices 50 of the orifice array 55 are positioned for alignment with terminals 20 carried by the substrate 10. To mate with the terminals 20 on the substrate 10 shown in FIG. 1, the orifices 50 in FIG. 2 are arranged into a regular array of component sets of orifices 52. Each of these component sets 52 comprises a pair of orifices 50. Each of the orifice pairs 52 of the stencil 40, therefore, may be associated with a corresponding terminal pair 22 on the substrate, with each orifice 50 of each orifice pair 52 being associated with one of the terminals 20 of the associated terminal pair 22. For example, the central terminals 20x of the central terminal pair 22x on the substrate 10 may be associated with the central orifices 50x of the central orifice pair 52x in the stencil 40. Likewise, the terminals 20a of the terminal pair 22a adjacent the upper left hand corner of the substrate 10 may be associated with the orifices 50a in the orifice pair 50a adjacent the upper left hand corner of the stencil 40; the terminals 20b of the terminal pair 22b adjacent the upper right hand corner of the substrate 10 may be associated with the orifices 50b in the orifice pair 52b adjacent the upper right hand corner of the stencil 40; the terminals 20c of the terminal pair 22c adjacent the lower left hand corner of the substrate 10 may be associated with the orifices 50c of the orifice pair 52c adjacent the lower left hand corner of the stencil 40; and the terminals 20d of the terminal pair 22d adjacent the lower right hand corner of the substrate 10 may be associated with the orifices 50b of the orifice pair 52b adjacent the lower right hand corner of the stencil 40.

The stencil 40 includes a stencil locus 54 which is adapted to be aligned with the substrate locus 24 during screen printing. The position of this stencil locus 54 will vary depending on the position of the substrate locus 24 for the corresponding substrate 10. In the illustrated design, the stencil locus 54 is located at the center of the stencil 40. In use, the stencil locus 54 may be indirectly registered with the substrate locus 24. For example, the stencil 40 may be aligned with respect to the substrate 10 by identifying the edges or fiducials 26 on the substrate 10 and simply centering the stencil 40 on the substrate. Centering the stencil 40 on the substrate 10 will inherently align the center of the stencil 40, which may be deemed the stencil locus 54, with the center of the substrate 10, which may be deemed the substrate locus 24.

Stencils 40 used in screen printing solder paste and the like onto electronic substrates 10 are conventionally formed of a material which will maintain good dimensional stability during the screen printing process. In particular, the material is selected to minimize changes in the size, shape and position of each of the orifices 50 in the stencil 40 during the screen printing process. Such stencils are commonly formed of a metal foil or a relatively rigid plastic.

FIG. 3 schematically illustrates a conventional screen printing process for depositing a solder paste 62 on an electronic substrate 10. Typically, the substrate 40 will be positioned above the substrate 10, with the terminal-bearing surface 14 of the substrate juxtaposed with the facing surface 46 of the stencil 40. By registering the stencil locus 54 (not shown in FIG. 3) with the substrate locus 24 (also not visible in FIG. 3), it is hoped that the orifices 50 will be precisely aligned with the corresponding terminals 20 on the substrate 10.

A quantity of a solder paste 62 is then typically applied on the upper surface 44 of the stencil 40. A squeegee 60 is drawn across the upper surface 44 of the stencil. As the squeegee 60 passes over an orifice 50 in the stencil 40, the solder paste 62 will fill the orifice 50. The volume of the orifice (i.e., the length and width of the orifice and the thickness of the stencil body 42) will determine, at least in part, the amount of solder paste deposited on the associated terminal 20 underlying the orifice 50.

Figure 4A:
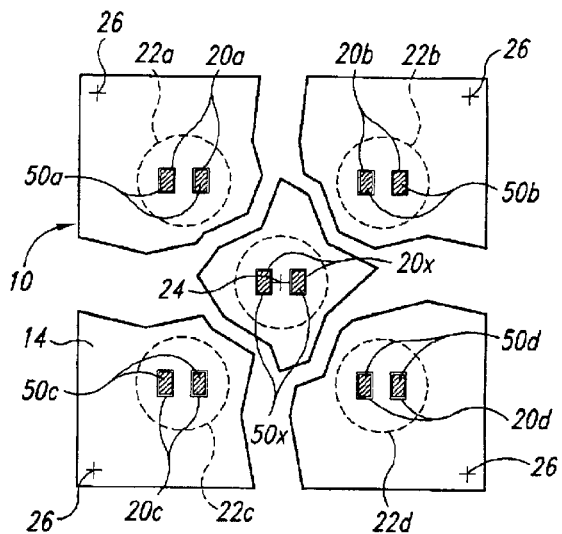
FIGS. 4A–4C schematically illustrate the results of screen printing using a conventional stencil such as that shown in FIG. 2.
Figure 4B:
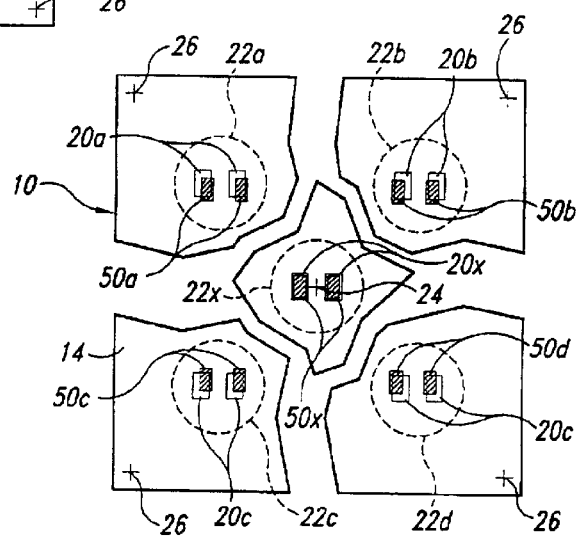
Figure 4C:
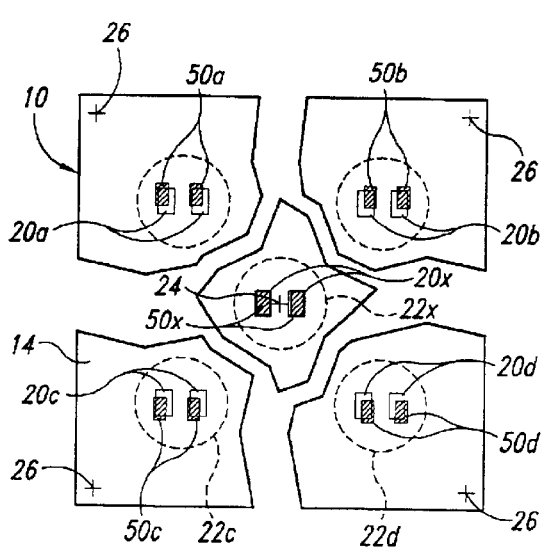

FIGS. 4A–4C schematically illustrate the results of a conventional screen printing operation. In FIGS. 4A–4C, the majority of the substrate 10 has been omitted to better illustrate the relative positions of the terminals 20 and orifices 50 during the screen printing operation. In particular, the substrate 10 has been broken away to leave only terminal pairs 22x, 22a, 22b, 22c, and 22d. For ease of understanding, the stencil 40 has been omitted and the areas occupied by the stencil orifices are cross-hatched to distinguish them from the corresponding terminals 20.

FIG. 4A illustrates the ideal registration of the substrate 10 and stencil 40. Each of the orifices 50 are precisely centered on its associated terminal 20. As a consequence, the entire volume of the solder paste 62 delivered through the orifices 50 will be applied directly atop the associated terminal 20.

Unfortunately, the ideal arrangement illustrated in FIG. 4A cannot always be assured. As noted above, handling and processing of the substrate 10 before the screen printing process can induce significant dimensional changes in the substrate 10. Conventionally, the orifice array 55 of the stencil 40 is formed for precise alignment with the initial terminal array 25 of the substrate 10. As the substrate 10 is dimensionally altered, however, the positions of the terminals in the terminal array will shift. As a consequence, the orifices 50 may not be aligned with the corresponding terminals 20 even if the substrate locus 24 and the stencil locus 54 are brought into precise registration with one another.

FIG. 4B schematically illustrates what may happen if the substrate 10 stretches between creation of the initial terminal array 25 and the screen printing operation. This may happen, for example, if the substrate 10 thermally expands more than it thermally contracts during thermal processing or if the substrate 10 is exposed to a more humid environment than anticipated and absorbs excess moisture. As a result of the dimensional changes in the substrate 10, many of the orifices 50 are not properly aligned with the corresponding terminals 20. In FIG. 4B, the orifices 50x adjacent the center of the stencil 40 are precisely aligned with the corresponding terminals 20x adjacent the center of the substrate 10. While this does not appear to be specifically recognized in the prior art, it is believed that the alignment of the orifices and terminals adjacent the center of the two structures may be attributed to the proximity of the orifices 50x to the stencil locus 54 and the proximity of the terminals 20x to the terminal locus 24.

The other orifices 50 shown in FIG. 4B are misaligned with the associated terminals 20. For example, the terminals 20a in the upper left-hand corner of the substrate 10 have shifted upwardly and to the left as the substrate 10 has stretched. Since the orifices 50a in the upper left-hand corner of the stencil 40 have not shifted from their ideal position, they are no longer aligned properly with the terminals 20a. Hence, only a portion of the solder paste delivered through the orifices 50a will be applied directly on top of the corresponding terminal 20a.

Similar alignment errors can arise if the substrate 10 shrinks. As shown in FIG. 4C, the orifices 50x adjacent the stencil locus 54 may be relatively precisely aligned with the terminals 20x adjacent the substrate locus 24. The other terminals 20 of the substrate 10 will have been drawn closer to the center of the substrate as the substrate shrank. For example, the terminals 20a in the upper left-hand corner of the substrate have shifted downwardly and to the right. Since the orifices 50a in the stencil 40 have not shifted from the position in the initial orifice array 55, the orifices 50a end up skewed to the left and higher than the corresponding terminals 20a.

As explained previously, the solder from the solder paste is what electrically and mechanically connects the microelectronic components 28 to the substrate 10. If the solder paste 62 is not properly applied in the screen printing process, the connections to the microelectronic components 28 mounted on the substrate 10 may be faulty, yielding commercially unacceptable products.

Figure 5A:
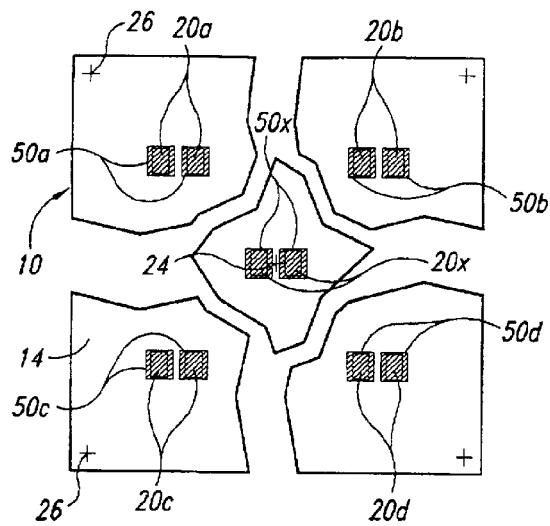
FIGS. 5A–5C schematically illustrate the results of screen printing using a stencil with uniformly oversized solder orifices.
Figure 5B:
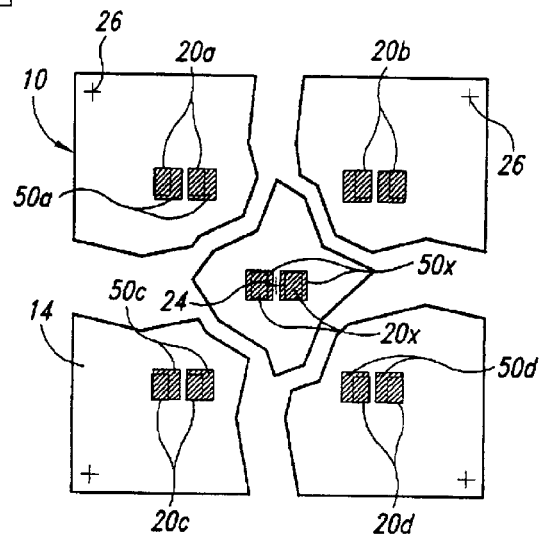
Figure 5C:
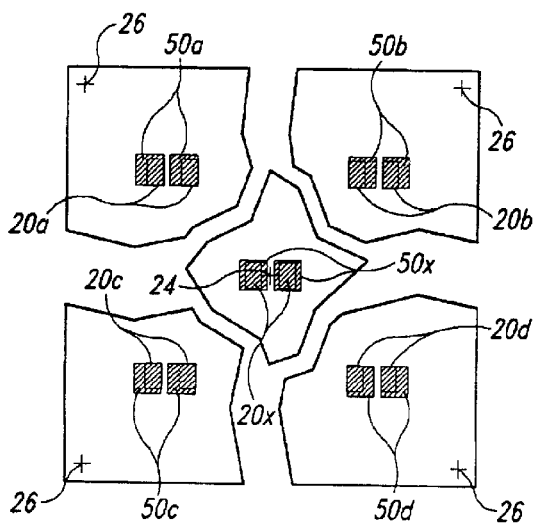

As made clear in FIG. 4, dimensional alteration of the substrate 10—be it stretching (FIG. 4B) or shrinking (FIG. 4C)—can lead to inadequate coverage of the terminals 20 on the substrate 10 using a conventional stencil 40. FIGS. 5A–5C illustrate one possible way to address the problems associated with dimensional changes in the substrate 10. By comparison with FIGS. 4A–4C, it can be seen that each of the orifices 50 in FIGS. 5A–5C have been enlarged. As a consequence, the entire surface of each terminal 20 is substantially entirely encompassed within the associated orifice 50 when the substrate 10 is substantially the same as initially produced (FIG. 5A), when the substrate 10 has stretched and the terminals 20 have moved outwardly from their initial positions (FIG. 5B), and when the substrate 10 has shrunk and the terminals 20 have moved inwardly from their positions in the initial terminal array 25 (FIG. 5C). This will ensure adequate solder to electrically connect the terminals of the microelectronic components to the terminals 20 of the substrate 10.

Unfortunately, the use of excess solder in this fashion can lead to its own difficulties. These difficulties are more acute with microelectronic components 28 which are smaller and packed more densely on the substrate 10 because the terminal pairs 22 are closer to one another and the terminals 20 of each terminal pair 22 are closer together. Looking at the upper left-hand corner of FIG. 5B, for example, the orifice 50a on the left is positioned much closer to the terminal 20a on the right than in the ideal arrangement shown in FIG. 4A. This close proximity, together with the excess volume of solder paste which may have been applied, increases the chances of bridging the two terminals 20a and creating a short-circuit.

Figure 6:
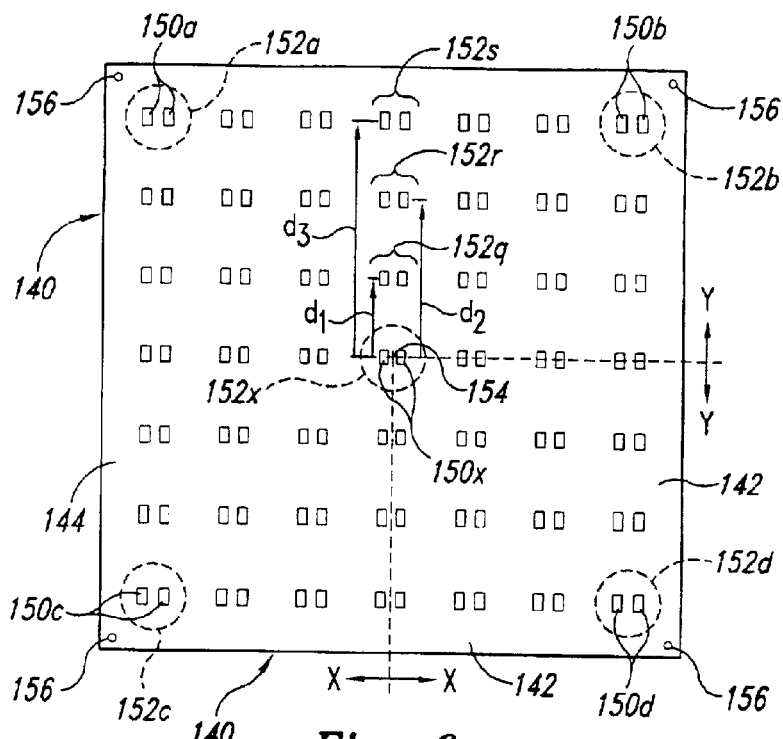
FIG. 6 is a schematic top view of a stencil in accordance with one embodiment of the invention.

FIG. 6 illustrates a substrate 140 in accordance with one embodiment of the present invention. For purposes of comparison with the conventional stencil 40 shown in FIG. 2, the reference numbers used in FIG. 6 are similar to the reference numbers used in FIG. 2, but incremented by 100. Hence, the substrate of FIG. 6 bears reference number 140 while the substrate of FIG. 2 bears reference number 40.

In the conventional substrate 40 shown in FIG. 2, each of the orifices 50 have substantially the same size. As shown in FIGS. 4A–4C, this can lead to inadequate coverage of the corresponding terminal 120. Although oversizing all of the orifices 50 as shown in FIGS. 5A–5C better ensures adequate coverage of each of the terminals 20, it increases the risk of product defects across the entire substrate 10. The novel stencil 140 of FIG. 6, however, has printing orifices 150 having varying sizes, with the size of each orifice 150 being correlated with the distance to the stencil locus 154. In particular, the change in size of each printing orifice 150 is proportional to the distance of that particular orifice 150 from the stencil locus 154.

Each of the orifices 150 of the stencil 140 should have a size at least as great as a predetermined minimum size. The predetermined minimum size may be an ideal size which is just large enough to deliver a volume of solder paste to the corresponding terminal 20 sufficient to produce a reliable electrical connection between the substrate 10 and the microelectronic component 28 to be mounted thereon. In the embodiment shown in FIG. 6, the orifices 150x positioned immediately adjacent the stencil locus 154 may have an initial size, which may be equal to or greater than the predetermined minimum size. At least some of the other orifices 150 of the substrate 140 will have a size different from the initial size. In one embodiment, at least some of the other orifices 150 have a size greater than the initial size, with the size increase in one embodiment of the invention being determined by a size scaling factor. The orifices 150x closest to the substrate locus 154 may have the predetermined minimum size while some or all of the other orifices 150 may have a size which is increased from the minimum size in proportion with the orifice's size scaling factor.

The size scaling factor for each of the orifices 150 is generally proportional to the distance of the orifice 150 from the stencil locus 154, which is at the center of the substrate 140 shown in FIG. 6. The orifice pair 152q is spaced a distance $d_1$ from the stencil locus 154, orifice pair 152r is spaced a distance $d_2$ from the substrate locus 154, and orifice pair 152s is spaced a distance $d_3$ from the stencil locus 154. The distance $d_1$ is less than distance $d_2$, and $d_2$ is less than $d_3$. Consequently, the size scaling factor for the innermost orifice pair 152q is less than the size scaling factor for the next orifice pair 152r and the size scaling factor for orifice pair 152r is less than the size scaling factor for orifice pair 152s.

If so desired, the size scaling factor for any individual orifice may be determined on an empirical basis. This may be accomplished by producing one or more substrates 10 and comparing the position of each terminal 20 on the resultant substrates 10 to the terminal's original position in the initial terminal array 25. Particularly if a plurality of substrates 10 are produced and the terminal positions are measured, this can permit one to empirically predict the shift in position for each of the terminals. The size scaling factor for each orifice 150 can then be selected to ensure that the corresponding terminal 20 will have sufficient coverage even if it shifts from its initial position in the initial terminal array 25.

In alternative embodiments of the invention, though, the size scaling factor is determined as a function of the distance from the stencil locus 154. In one such embodiment, the size scaling factor increases linearly as the distance from the stencil locus 154 increases. Stated mathematically, the size S of a particular orifice may be determined in accordance with one such embodiment by the following Formula 1a:

$$S=S_0(1+nd),$$

wherein S is the size of the orifice 150, $S_0$ is an initial orifice size, and (1+nd) is the size scaling factor. In the size scaling factor, n is a predetermined size scaling constant and d is the distance of the orifice 150 from the stencil locus 154. In one application of this embodiment, the initial orifice size $S_0$ may be equal to the predetermined minimum orifice size, noted above.

The value of the size scaling constant n in this formula will vary depending upon a number of factors, including, but not limited to, the material of which the substrate 10 is made, the thickness of the substrate body 12, the processing temperatures and pressures to which the substrate 10 is subjected after initial layout of the terminal array 25 and prior to the stenciling operation, and mechanically induced stresses on the substrate 10 encountered prior to the screening process. Initially, it may be advantageous to create a number of similar substrates 10 and subject them to the anticipated handling process to determine the value of n for that particular combination of substrate materials and handling conditions. Over time, though, experience with a variety of different substrate materials and handling conditions can permit a fair approximation of the value n for any particular combination of substrates 10 and handling conditions.

The stencil 140 may be formed of any desired material. Preferably, the stencil 140 is formed of dimensionally stable material to minimize the changes in the size, shape and position of the orifices 150 during the screen printing operation. Any of a variety of conventional stencil materials can be used, including metal foils and thin sheets of relatively rigid polymeric materials.

The printing orifices 150 in the stencil 140 are adapted to control the application of a solder paste 62 on the terminals 20 of an electronic substrate 10. The stencil 140 may include other non-printing orifices in addition to these printing orifices 150. For example, one or more registration holes 156 may pass through the stencil body 142. Such registration holes may receive a registration pin carried by the substrate 10 or a frame of the screen printing apparatus (not shown) to assist in registering the stencil locus 154 with the substrate locus 24.

It is anticipated that the absolute shift in position of the terminals 20 with respect to the substrate locus 24 will increase as a function of distance from the substrate locus 24. For example, a substrate 10 may stretch by one percent in each direction between the time that the initial terminal array is arranged on the substrate 10 and the time of the screen printing operation. It is expected that this one percent stretch will be relatively uniformly distributed across the entirety of the substrate, at least for fairly isotropic substrates. While each of the terminals 20 may move position by about one percent, one percent of the distance from the substrate locus 24 to the closest terminals 20x is a significantly smaller absolute number than one percent of the distance from the substrate locus 24 to outlying terminals 20a, for example.

The stencil 140 in accordance with this embodiment of the invention keeps the orifices 150 closer to the stencil locus 154 relatively small while enlarging orifices in outlying orifice pairs, e.g., orifices 150a, more significantly. This enlarges the outlying orifices sufficiently to accommodate shifts in position of the corresponding terminals 20 without unduly increasing the size of other orifices, reducing the problems associated with oversized orifices noted in connection with FIGS. 5A–5C.

Formula 1a is anticipated to be particularly well suited for fairly isotropic substrates 10. If the dimensional change characteristics for a particular substrate 10 are more anisotropic, the substrate 10 will change dimension more in one direction than in another during processing. In such a circumstance, having a fixed scaling constant for all directions from the stencil locus 154 may not yield results which are as precise as desired. To increase precision for more anisotropic substrates 10, the dimensional change characteristics in two or more measurement directions for the substrate 10 can be determined or estimated as noted above and the size scaling factor for each orifice may be determined as a function of the distance of the orifice from the stencil locus 154 in each of the measurement directions. This relationship may be stated mathematically for two selected directions by Formula 1b:

$$S=S_0(1+n_x d_x+n_y d_y)$$

wherein S is the size of a particular orifice 150, $S_0$ is an initial orifice size and $(1+n_x d_x+n_y d_y)$ is the size scaling factor. In the size scaling factor, $n_x$ is a first directional size scaling constant related to a first direction x, $n_y$ is a second directional size scaling constant related to a second direction y, $d_x$ is the distance measured in the first direction x of the printing orifice from the locus and $d_y$ is the distance measured in the second direction y of the printing orifice from the locus. In one application of this embodiment, the initial orifice size $S_0$ may be equal to the predetermined minimum size.

The first and second directions x and y may be selected as desired. In one embodiment, one of these directions is selected to coincide with the direction with the greatest dimensional change in the substrate 10 whereas the other direction is selected to coincide with the least dimensional change. In FIG. 6, the first direction x is illustrated as being generally horizontal while the second direction y is illustrated as being generally vertical. The distance $d_x$ in this embodiment is a distance from a vertical line passing through the stencil locus 154 along the horizontal line x—x and the distance $d_y$ is a distance from a horizontal line passing through the stencil locus 154 along the vertical line y—y.

It may be determined that the dimensional changes in the substrate 10 with which the stencil 140 will be used is negligible in one of the first and second directions x and y. In such a case, the directional size scaling constant related to that direction may be set as zero. If the dimensional change of the substrate 10 in the second direction is negligible, the second size scaling constant $n_y$ may be set equal to zero, yielding Formula 1c:

$$S=S_0(1+n_x d_x)$$

If the dimensional change of the substrate in the first direction is negligible, the first size scaling constant $n_x$ may be set equal to zero, yielding Formula 1d:

$$S=S_0(1+n_y d_y)$$

In each of Formulas 1a–d, the size scaling factor was assumed to be linearly proportional to the distance of the orifice 150 from the stencil locus 154. It should be recognized, however, that a size scaling factor which is non-linearly proportional to this distance may yield more precise results for some substrates. By analogy to Formula 1a, the size of a particular orifice 150 for use with more isotropic substrates may be determined according to the generalized Formula 1e:

$$S=S_0(1+nf(d))$$

wherein S, $S_0$ and n have the same meanings as in Formula 1a and $f(d)$ is a function of the distance of the orifice 150 from the locus 154. This function $f(d)$ may be determined through any combination of empirical observation and reasonable approximation, in a manner analogous to the determination of the size scaling constant n noted above. The function $f(d)$ need not be a linear relationship. For example, the function $f(d)$ may be a second order or higher geometric relationship. In one embodiment, the function $f(d)$ is the square root of d, yielding a size scaling factor of $(1+nd^{1/2})$. Analogous adaptations of Formulas 1b–d may be made for stencils 140 used with more anisotropic substrates 10.

Figure 7A:
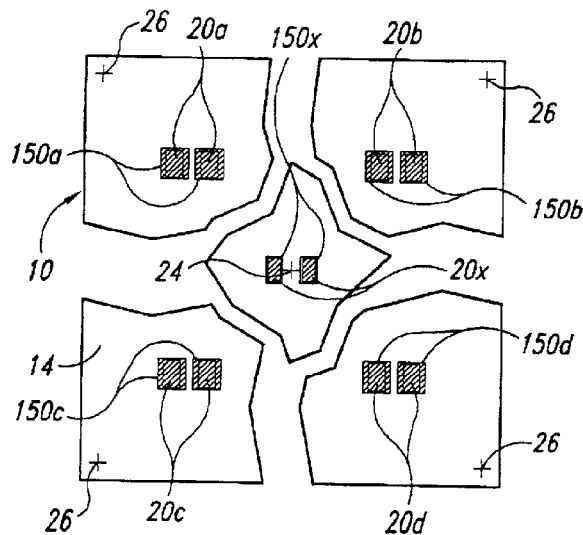
FIGS. 7A–7C schematically illustrate the results of screen printing using a stencil with variably sized orifices in accordance with an embodiment of the invention.
Figure 7B:
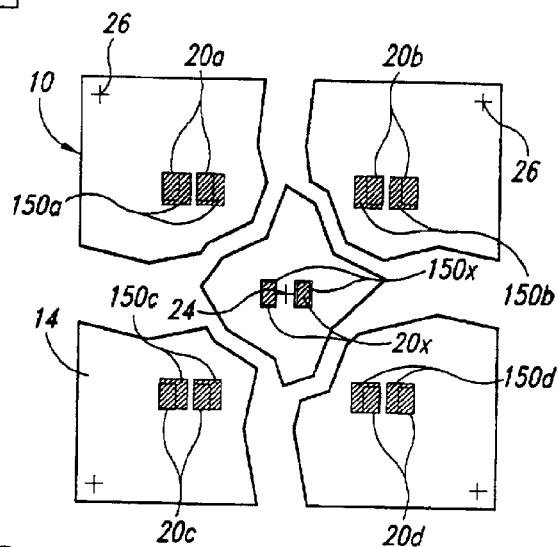
Figure 7C:
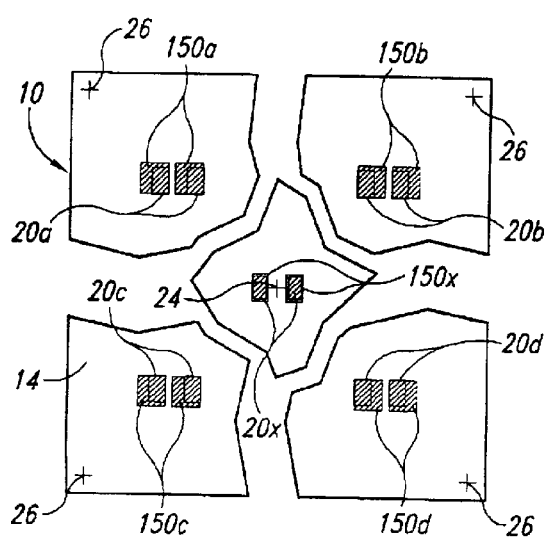

FIGS. 7A–7C schematically illustrate the advantages of the stencil 140 over the processes discussed in FIGS. 4 and 5. FIG. 7A illustrates a substrate 10 in which the terminals 20 have not moved substantially from their initial positions in the initial terminal array 25, shown in FIG. 1. In this circumstance, the orifices 150x positioned closest to the substrate locus 24 (with which the stencil locus, not shown in this drawing, is registered) have a predetermined minimum size. This ensures an adequate volume of solder paste for the associated terminals 20x without unnecessarily extending the area covered by solder paste beyond the margins of the terminals 20x. The other orifices 150a, 150b, 150c, and 150d shown in FIGS. 7A–7C are all spaced a substantial distance from the substrate locus 154, as is evident in FIG. 6. Since the terminals 20 have not moved from their initial positions, they remain within the associated orifices 150. As shown in FIG. 7A, this results in an excess volume of solder paste being delivered to the outlying terminals 20a, 20b, 20c, and 20d.

FIG. 7B illustrates the alignment of the stencil 140 with a substrate 10 which has stretched since the initial terminal array 25 was laid down. Because the outlying orifices, such as orifices 150a, are larger than those closer to the center, these orifices will cover sufficient area to ensure that the corresponding terminals 20a receive sufficient solder paste to ensure a reliable electrical connection with terminals of the microelectronic component 28 attached thereto. As shown in FIG. 7C, if the substrate 10 shrinks instead of stretches, the oversized orifices, e.g., 150a, cover sufficient access area to ensure that the corresponding terminals 20a receive sufficient solder paste thereon.

Figure 8:
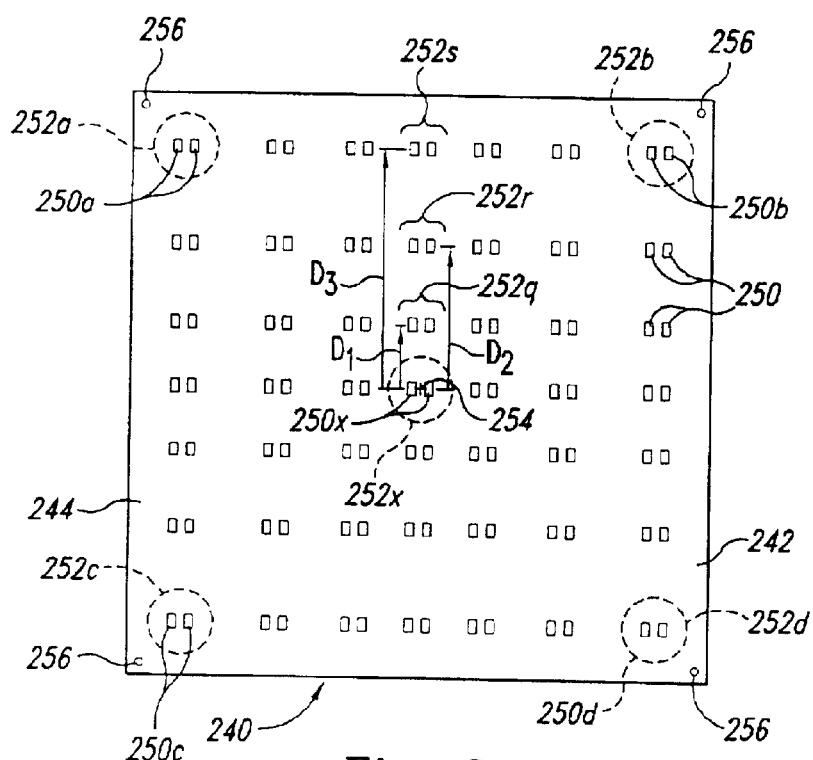
FIG. 8 is a schematic top view of a screen-printing stencil in accordance with an alternative embodiment of the invention.

FIG. 8 illustrates a stencil 240 in accordance with an alternative embodiment of the invention. Elements analogous to those in FIG. 6 bear like reference numbers, but incremented by 100. Hence, the substrate in FIG. 8 bears reference number 240 while the substrate in FIG. 6 bears reference number 140.

The orifices 150 of the stencil 140 of FIG. 6 vary in size, but their centers remain aligned with their original ideal position, i.e., the position corresponding to the position of the associated terminal 20 in the initial target array 25. In the embodiment of FIG. 8, the size of each orifice 250 may remain substantially unchanged from the predetermined minimum size noted above, but the position of the orifice 250 is adjusted to accommodate anticipated dimensional changes in the substrate 10.

More particularly, the position of each orifice 250 is displaced from its ideal position by a predetermined offset. If so desired, the predetermined offset for each individual orifice may be determined empirically by measuring the change in position of each terminal 20 on a plurality of similar substrates 10. By determining the average shift in position for each terminal 20 in the initial terminal array 25, the offset for each orifice 250 may be selected to align with the average altered position for the associated target 20.

In an alternative embodiment of the invention, the predetermined offset for a particular orifice 250 from its ideal position is proportional to a distance of the orifice 250 from the stencil locus 254. If so desired, one of the orifices 250 may encompass the stencil locus 254. For example, if the stencil locus 254 is the center of the stencil 240, an orifice 250 may be positioned on the center of the stencil 240. Such a central orifice may have a predetermined offset of zero such that the position of the central orifice corresponds directly to the position of an associated central target (not shown in FIG. 1) in the initial target array 25. The substrate 240 of FIG. 8 does not include such a central orifice encompassing the stencil locus 254. However, the two orifices 250x of the central orifice pair 252x are both positioned closely adjacent the stencil locus 254. Accordingly, their predetermined offset from their ideal positions may be quite small. If so desired, such relatively small offsets may be arbitrarily rounded down to zero such that the positions of such orifices will directly correspond to their ideal positions.

The predetermined offset for each of the other orifices 250 may be linearly correlated with the distance of the orifice from the locus 254. Stated mathematically, the position P of any given orifice 250 may be determined according to the following Formula 2:

$$P=P_0+md,$$

wherein $P_0$ is the ideal position of the orifice 250, m is a position scaling constant, and d is the distance of the ideal position $P_0$ of the orifice 250 from the stencil locus 254. The term md in this formula is the predetermined offset for the orifice 250. If it were a mere distance value, it would permit a range of positions P spaced a radius md from the ideal position $P_0$. Accordingly, d may be thought of as a vector extending from the stencil locus 254 to the ideal position $P_0$. This will yield a vector value for the predetermined offset, specifying both distance (i.e., the magnitude of the predetermined offset) and direction to more precisely define the position P of the orifice 250.

The value of the position scaling constant m will vary depending on the nature of the substrate and its handling from the time the terminals 20 are initially arranged in the initial terminal array 25 and the time of the stenciling operation. The value of the position scaling constant m may be positive (where the substrate 10 is expected to stretch) or negative (where the substrate 10 is expected to shrink). As noted above in connection with the size scaling constant m, a variety of factors can effect the extent to which the terminal positions on the substrate 10 can shift prior to the stenciling operation. The position scaling constant m and the size scaling constant n are associated with different approaches for addressing the same underlying problem, i.e., shifts in the positions of the terminals 20 from their initial positions in the initial terminal array 25. As a consequence, the determination of the position scaling constant m may be carried out in substantially the same fashion as determination of the size scaling constant n, as explained above. In one embodiment of the invention, the size scaling constant n is the absolute value of the position scaling constant m.

Empirically determining the predetermined offset for each of the orifices 250 individually may prove to be slightly more accurate than determining the offset as a linear function of the distance from the substrate locus 254. It is anticipated, however, that adjustment of the offset by a vector md in accordance with the preceding formula can greatly simplify stencil design. In empirically determining the offset for each orifice 250, a new set of data would have to be collected each time some aspect of the substrate or its handling process is altered. Adjusting the predetermined offset mathematically in accordance with an embodiment of the invention makes it possible to provide a fair approximation of the desired location of each orifice for any combination of substrates and handling conditions. The simple mathematical relationship also makes it easier to use a computer to quickly design an appropriate stencil 240 because it eliminates the need for a complex matrix of values, with a separate value for each orifice's offset.

Formula 2a is anticipated to be particularly well suited for fairly isotropic substrates 10. As noted above, however, some substrates change dimensions anisotropically during processing. If so desired, the predetermined offset for each orifice 250 may be determined as a function of the distance of the orifice 250 from the locus 254 in two or more selected directions. By analogy to Formula 1b, if the substrate exhibits different dimensional changes in a first direction x and a second direction y, the position of a particular orifice 250 may be determined according to Formula 2b:

$$P = P_0 + (m_x d_x + m_y d_y)$$

wherein $P_0$ is the ideal position of the orifice 250 and $(m_x d_x + m_y d_y)$ is the predetermined offset for the orifice 250. In the predetermined offset, $m_x$ is a first directional position scaling constant related to the first direction x, $m_y$ is a second directional position scaling constant related to the second direction y, $d_x$ is a first vector component of the vector d (Formula 2a) along the first direction x, and $d_y$ is a second vector component of the vector d along the second direction y.

As noted above, the dimensional changes in the substrate with which the stencil 240 will be used may be negligible in one of the first and second directions x and y. In such a case, the directional position scaling constant related to that direction may be set as zero. If the dimensional change of the substrate in the second direction is negligible, for example, the second position scaling constant $m_y$ may be set equal to zero, yielding Formula 2c:

$$P = P_0 + m_x d_x$$

If the dimensional change of the substrate in the first direction is negligible, the first position scaling constant $m_x$ may be set equal to zero, yielding Formula 2d:

$$P = P_0 + m_y d_y$$

In each of Formulas 2a–d, the position scaling factor was assumed to be linearly correlated to the distance of the orifice 250 from the stencil locus 254. It should be recognized, however, that a position scaling factor which is non-linearly proportional to this distance may yield more precise results for certain substrates and/or handling conditions. Hence, for more isotropic substrates, the size of a particular orifice 250 may be determined according to the generalized Formula 1e:

$$P = P_0 + mf(d)$$

wherein P, $P_0$ and m have the same meanings as in Formula 2a and $f(d)$ is a function of the distance vector of the orifice 150 from the locus 154. The function $f(d)$ can be a linear or non-linear relationship. For example, the function $f(d)$ may be a second order or higher geometric relationship. Analogous adaptations of Formulas 2b–d may be made for stencils 240 used with more anisotropic substrates 10.

FIG. 8 schematically illustrates a stencil 240 in which the positions of the orifices 250 have been offset in accordance with Formula 2a. The stencil 240 may be used with a substrate 10 having an initial terminal array 25 in which each of the terminal pairs 22 is equidistant from the next adjacent terminal pair 22. This would dictate that the space from the ideal position of one orifice pair 252 to the next would remain constant along any given vector from the stencil locus 254. In the context of FIG. 8, if the orifices 250 were in their ideal positions for such a regular terminal array, the distance from the locus 254 to the orifice pair 252q would be the same as the distance from orifice pair 252q to orifice pair 252r, and the distance from orifice pair 252r to orifice pair 252s.

In the embodiment of FIG. 8, the distances between successive orifice pairs 252 moving outwardly along a path from the locus 254 remains the same. The distance $D_1$ from the locus 254 to orifice pair 252q is the distance from the locus 254 to the ideal position $P_0$ adjusted by the offset md for the orifices of this orifice pair 252q. Likewise, the orifice pair 252r is spaced a distance $D_2$ from the locus 254 and the orifice pair 252s is spaced a distance $D_3$ from the locus 254. Due to the linear increase in the position offset of the orifices moving away from the locus 254 in accordance with Formula 2a, the value of the offset md increases but the change in distance between adjacent orifices will remain constant such that $D_1 = D_2 - D_1 = D_3 - D_2$.

FIG. 8 illustrates an embodiment wherein the stencil 240 has been adjusted to accommodate a substrate 10 which stretches after the initial arrangement of the initial terminal array 25. In such a circumstance, the position scaling constant m is a positive number. It is expected that some substrates may shrink in certain handling situations. For such substrates, the position scaling constant m may be a negative number. For such substrates, the orifices 250 will be moved in from their ideal position P by a negative offset vector md. The distance from one orifice 250 to the next along a given vector from the locus 254 will remain constant if the initial terminal array 25 is a regular array. Hence, for such a substrate, the relationship of the distances $D_1$-$D_3$ would remain $D_1=D_2$-$D_1=D_3$-$D_2$.

The stencil 240 may be formed of any suitable material. As with the stencil 140, this material may comprise a metal foil or a thin sheet of a polymeric material.

Figure 9A:
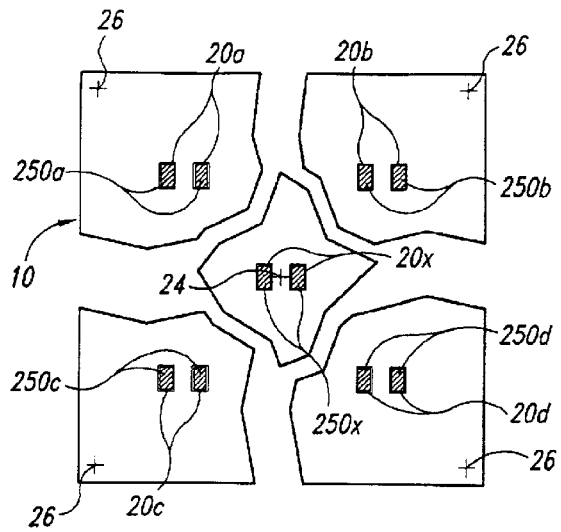
FIGS. 9A–9C schematically illustrate the results of screen printing using a stencil with position-adjusted orifices in accordance with an embodiment of the invention.
Figure 9B:
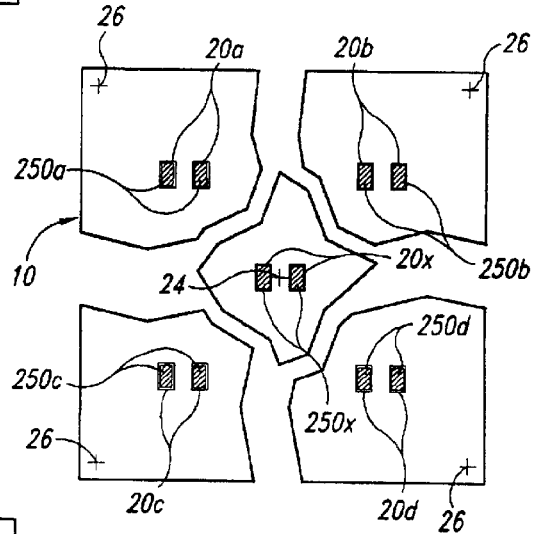
Figure 9C:
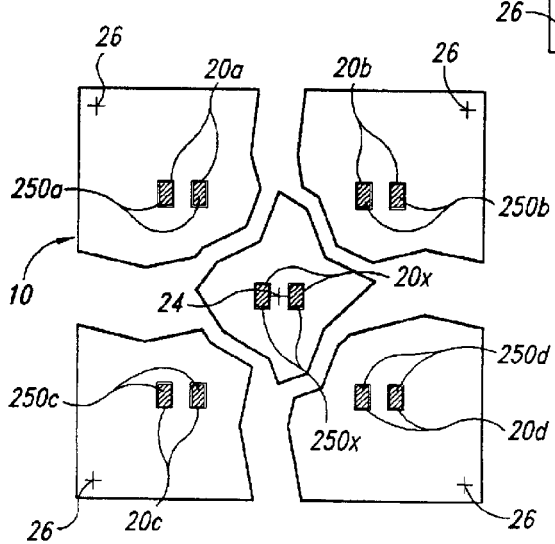

FIGS. 9A–9C schematically illustrate the ability of the stencil 240 of FIG. 8 to compensate for dimensional variations in the substrate 10. In a manner analogous to FIGS. 4A–4C, FIG. 9A illustrates the position of the stencil orifices 250 with respect to a substrate 10 in which the terminals 20 have not shifted from their initial positions; FIG. 9B shows what is expected to happen if the substrate 10 expands in size; and FIG. 9C shows what is expected to happen if the substrate 10 shrinks in size. In each instance, the adjusted position of the orifices 250 aligns each orifice 250 with its associated terminal 20 even though the relative positions of the terminals 20 have changed. This is a marked improvement over the misalignments shown in FIGS. 4B and 4C using a standard stencil 40 which has not been altered in accordance with the embodiment of the invention.

The alignments shown in FIGS. 9A–9C are somewhat idealized. Each of the orifices 250 have been repositioned to align with the anticipated position of the associated terminal 20 even if the substrate changes dimensions. However, variations in the exact thickness and composition of the substrate or variations in substrate handling, such as processing temperatures or pressures, can lead to variations in the positions of the terminals 20. As a consequence, the precise alignment of each of the orifices 250 with its associated terminal 20 cannot always be assured. While the stencil 240 of FIG. 8 represents a significant advance over the stencil 40 of FIG. 2, it is possible that minor variations in the final terminal positions can lead to some slight misalignments of the orifices 250 with the corresponding terminals 220.

In accordance with another embodiment of the invention, the size scaling approach of FIG. 6 and the position adjusting approach of FIG. 8 can be combined in a single stencil (not shown). Such a stencil will have the size of each orifice correlated with a first size by a size scaling factor and the position of each printing orifice displaced by a predetermined offset. The size S of each orifice may be determined in accordance with any one of Formulas 1a–1e and the position of each orifice may be determined in accordance with any one of Formulas 2a–2e. The value of the size scaling constant (e.g., n in Formula 1a) in this embodiment may be less than that in the embodiment of FIG. 6. In the embodiment of FIG. 6, the orifices may be made large enough to accommodate the entire shift in position of the terminals 20 away from their initial positions. If the positions of the orifices are also adjusted by the predetermined offset in accordance with the instant embodiment of the invention, though, the size of the orifice need only be adjusted sufficiently to accommodate variations in the movement of the terminals from one substrate to the next similar substrate. As a consequence, the outer orifices (e.g., 150*a*) may be made smaller than shown in FIGS. 6 and 7, but still accommodate manufacturing variability from one substrate to the next. In this embodiment, the position scaling constant (e.g., m in Formula 2a) may be correlated to the mean shift in terminal position while the size scaling constant (e.g., n in Formula 1a) may be correlated to the standard deviation in terminal position.

As noted above, another embodiment of the invention contemplates a subassembly for manufacturing an electronic device. Such a subassembly may include an electronic substrate 10 and a stencil in accordance with the invention, such as stencil 140 of FIG. 6 or stencil 240 of FIG. 8. In a manner analogous to that shown in FIG. 3, the facing surface of the stencil 140 or 240 is juxtaposed with the terminal-bearing surface 14 of the substrate 10. The stencil locus 154 or 254 may be registered with the substrate locus 24 using conventional techniques to align the stencil 140 or 240, respectively, with the substrate 10. If the stencil 140 of FIG. 6 is employed in this subassembly, the larger sizes of the outlying orifices 150 will permit the outlying terminals 20 to be appropriately positioned with respect to the orifice 150 and receive a suitable volume of solder paste thereon, as shown in FIGS. 7A–7C. If the stencil 240 of FIG. 8 is instead use, the positional offsets of the orifices will ensure adequate alignment of the orifices 250 with the terminals 20 even if the terminals 20 have moved, as illustrated in FIGS. 9A–9C.

In accordance with another embodiment, the present invention provides a method of applying solder paste 62 on an electronic substrate 10 using a stencil, e.g., stencil 140 of FIG. 6 or stencil 240 of FIG. 8. The electronic substrate 10 may be manufactured such that the terminals 20 are connected to internal circuitry 29 in the substrate 10 by positioning the terminals 20 on the terminal-bearing surface 14 in the desired initial terminal array 25. Thereafter, the substrate body 12 may be dimensionally altered such that the relative relationship of the terminals 20 differs from the relative relationship 20 in the initial terminal array 25. A stencil may then be positioned such that a facing surface of the stencil 10 is juxtaposed with the terminal-bearing surface 14 of the substrate 10 and the stencil locus (e.g., 154) is in registry with the substrate locus 24. The orifices in the stencil may be resized and/or repositioned from their predetermined minimum sizes and/or ideal positions as outlined above. Hence, in one variation of this embodiment, a stencil similar to that shown in FIG. 6 may be employed, wherein each solder orifice 150 has a size correlated to an ideal, predetermined minimum size by a size scaling factor. In an alternative version of this embodiment, a positionally adjusted stencil such as stencil 240 of FIG. 8 may be employed. In such a stencil 240, the position of each orifice 250 is displaced by a position scaling factor from an ideal position which corresponds to a position of an associated terminal 20 in the initial terminal array 25. In still another variation of this embodiment, the size of each solder orifice is correlated to an ideal size, which may, but need not, be the predetermined minimum size noted above, by a size scaling factor and the position of each solder orifice as displaced from its ideal position by a predetermined offset.

Once the appropriate stencil has been chosen and positioned with respect to the substrate 10, a solder paste may be passed through the orifices (e.g., 150 or 250) in the substrate to deposit a discrete volume of solder paste on each corresponding terminal 20. By analogy to FIG. 3, this may be accomplished by drawing a squeegee 60 across the outer face 144 or 244 of the stencil 140 or 240, respectively. The size of each orifice 150 or 250 and a thickness of the stencil body 142 or 242 will determine, at least in part, the volume of solder paste 62 delivered through the orifice. If the orifice sizes are adjusted, such as in the stencil 140 of FIG. 6, the volume of solder paste delivered through orifices closer to the stencil locus (e.g., orifices 150*x*) will be less than the volume of solder paste delivered through orifices farther from the stencil locus (e.g., orifices 150*a*).

Another embodiment of the invention provides a method of designing a stencil. This method is particularly well suited for designing stencils for applying solder paste on a plurality of like electronic substrates. In accordance with this method, the substrate 10 will be designed such that the positions of the terminals 20 in the initial terminal array 25 will be determined. A dimensional change coefficient for the initial terminal array 25 may then be estimated in light of substrate design and anticipated handling of the substrates 10 prior to solder deposition. This dimensional change coefficient may be equal to the size scaling constant n, the position scaling constant m, or another number, such as a combination of the constants n and m.

The locus of the stencil may then be determined. In the context of the stencil 140 of FIG. 6, this may be determined by deciding to center the stencil 140 on the substrate 10 for purposes of the screen printing operation. An initial orifice size may be selected to ensure that an appropriate volume of solder paste 62 is delivered through the orifice 150 to an underlying terminal. If so desired, this initial orifice size may be the predetermined minimum orifice size noted above. A plurality of solder orifices 150 may then be arranged within the boundaries of the stencil 140, with a separate orifice 150 corresponding to each terminal 20 of the substrate 10. Each orifice 150 may be sized such that the size of each orifice 150 is proportional to the distance of the orifice 150 from the stencil locus 154, as detailed above. Instead of, or in addition to, resizing each orifice 150, the position of each orifice 150 may be moved by a predetermined offset in accordance with the embodiment of the invention discussed above in connection with FIG. 8.

Figure 10:
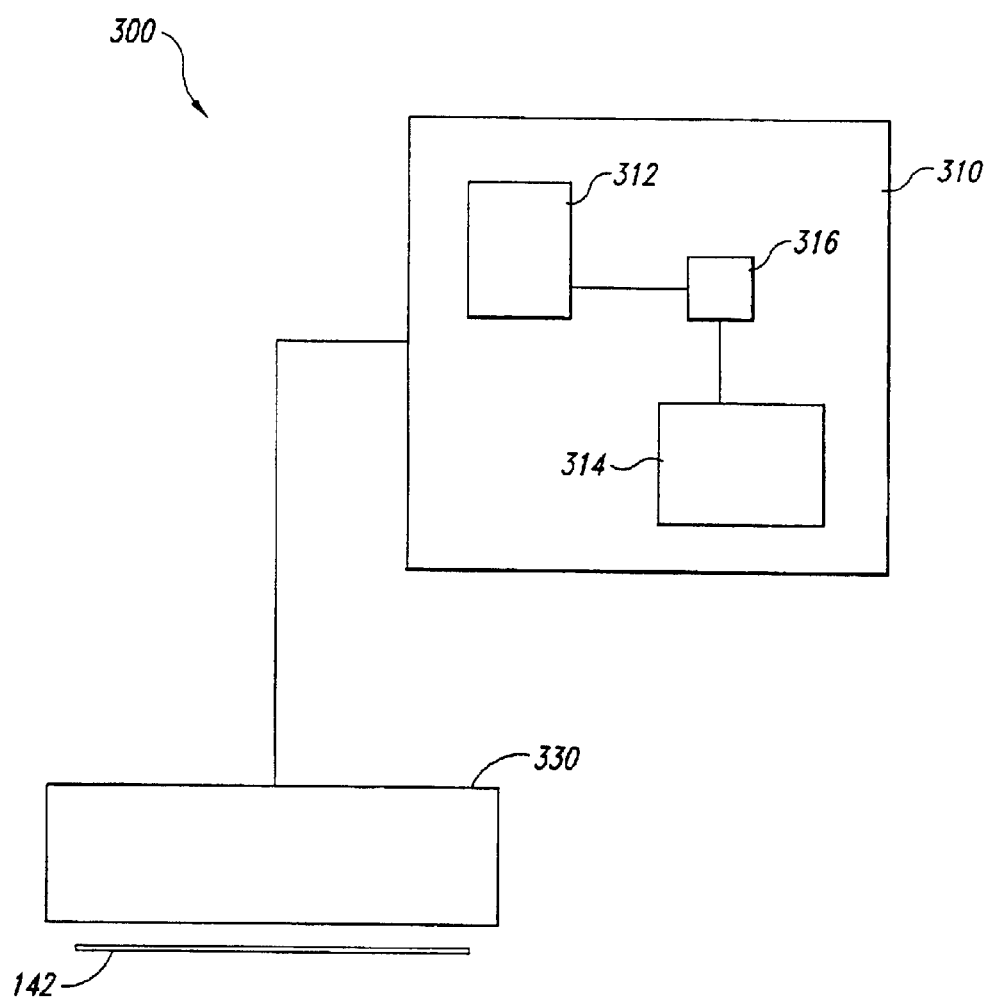
FIG. 10 is a schematic diagram illustrating a system for designing a stencil in accordance with another embodiment of the invention.

Still another embodiment of the invention provides a system for designing a stencil for applying solder paste on a plurality of like substrates. One such system is schematically illustrated in FIG. 10. This system 300 generally includes a computer 310 having a memory circuit 312, a computer readable storage medium 314 and a processor 316. The structure of these components may be fairly conventional. Hence, the memory circuit 312 may comprise both random access memory (RAM) and read only memory (ROM). The ROM portion of the memory circuit 312 will typically include a program which is used by the computer 310 when power is first supplied to the computer, including a BIOS for initializing the processor 316 and other components in the computer 310.

The computer readable storage medium 314 contains a computer readable code for operating the computer 310 to perform a method in accordance with the invention. The computer readable storage medium may be of any form which permits the computer to read program instructions contained therein for execution by the processor 316. The storage medium 314 may, for example, comprise a hard disk drive, a floppy disk drive, a CD-ROM, or a flash memory card.

The processor 316 is connected to the memory circuit 312 and the computer readable storage medium 314. The processor should be capable of executing the program instructions stored on the computer readable medium to carry out a method of the invention. The processor 316 may comprise a conventional central processing unit, such as those available from Intel Corporation.

The computer 310 may be used to carry out the process of designing a stencil outlined above. If so desired, the system 300 may also include a stencil forming tool 330 operatively connected to the computer 310. The stencil forming tool 330 may be used to cut a stencil body 142, forming the orifices 150 therein to create the stencil 140 of FIG. 6, for example. Any of a wide variety of appropriate tools could be used as the stencil forming tool, including precision computer-controlled cutting tools such as electron discharge mills or the like.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

What is claimed is:

1. A printing stencil adapted for registration with an electronic substrate about a locus, the stencil comprising a stencil body and an array of printing orifices passing through the stencil body, the printing orifices having varying sizes, with the size of each printing orifice being a function of a distance of the printing orifice from the locus.

2. The printing stencil of claim 1 wherein the size of each printing orifice is linearly correlated to the distance of the printing orifice from the locus.

3. The printing stencil of claim 1 further comprising at least one non-printing orifice in the stencil body.

4. The printing stencil of claim 3 wherein the non-printing orifice comprises a registration hole for receiving a registration pin.

5. The printing stencil of claim 1 wherein the stencil body comprises a metal foil.

6. The printing stencil of claim 1 wherein the locus comprises a center of the stencil body.

7. The printing stencil of claim 1 wherein the locus comprises a location equidistant from a plurality of fiducial alignment locations adapted for alignment with corresponding fiducial marks carried on a substrate.

8. The printing stencil of claim 1 wherein the size of each printing orifice is a first size adjusted by a size scaling factor, the size scaling factor being equal to one at the locus and increasing radially outwardly therefrom.

9. The printing stencil of claim 8 wherein the size scaling factor increases linearly outwardly from the locus.

10. The printing stencil of claim 8 wherein the size scaling factor increases non-linearly outwardly from the locus.

11. The printing stencil of claim 8 wherein the size scaling factor decreases outwardly from the locus.

12. The printing stencil of claim 1 wherein the size of each printing orifice may be calculated according to the formula $S=S_0(1+n_x d_x)$, wherein S is the size of the orifice, $S_0$ is an initial printing orifice size, $n_x$ is a directional size scaling constant related to a first direction x, and $d_x$ is the distance measured in the first direction x of the printing orifice from the locus.

13. The printing stencil of claim 1 wherein the size of each printing orifice may be calculated according to the formula $S=S_0(1+n_x d_x+n_y d_y)$, wherein S is the size of the orifice, $S_0$ is an initial printing orifice size, $n_x$ is a first directional size scaling constant related to a first direction x, $n_y$ is a second directional size scaling constant related to a second direction y, $d_x$ is the distance measured in the first direction x of the printing orifice from the locus and $d_x$ is the distance measured in the second direction y of the printing orifice from the locus.

14. A soldering stencil adapted for registration with an electronic substrate about a locus, the stencil comprising a stencil body, a first component set of solder printing orifices passing through the stencil body proximate the locus, and a second component set of solder printing orifices passing through the stencil body, the solder printing orifices of the first component set having a first size and being configured to correspond to a configuration of contacts on a single component type that is to be surface mounted, the solder printing orifices of the second component set having a second size and being configured to correspond to a configuration of contacts of the same single component type, wherein the second size is equal to the first size adjusted by a size scaling factor that is proportional to a distance of the second component set from the locus.

15. The soldering stencil of claim 14 wherein each of the first and second component sets comprises a pair of solder printing orifices, one solder printing orifice of the pair being positioned for alignment with a first contact of one component and the other solder printing orifice of the pair being positioned for alignment with a second contact of the same component.

16. The soldering stencil of claim 14 further comprising at least one non-printing orifice in the stencil body.

17. The soldering stencil of claim 14 wherein the locus comprises a center of the stencil body.

18. The soldering stencil of claim 14 wherein the locus comprises a location equidistant from a plurality of fiducial alignment locations adapted for alignment with corresponding fiducial marks carried on a substrate.

19. A soldering stencil adapted for applying solder to terminals of a terminal array carried by an electronic substrate, the stencil comprising a stencil body having a center and an array of solder orifices passing through the stencil body, at least one central solder orifice of the array having a first size, other solder orifices of the array having a size differing from the first size, with the change in the size of the other solder orifices being determined by a size scaling factor which is proportional to a distance of the solder orifice from the center of the stencil body.

20. The printing stencil of claim 19 wherein the size scaling factor changes linearly outwardly from the locus.

21. The printing stencil of claim 19 wherein the size scaling factor increases linearly outwardly from the locus.

22. The printing stencil of claim 19 wherein the size scaling factor for each orifice is equal to $1+n_x d_x + n_y d_y$, wherein $n_x$ is a first directional size scaling constant related to a first direction x, $n_y$ is a second directional size scaling constant related to a second direction y, $d_x$ is the distance measured in the first direction x of the printing orifice from the locus and $d_y$ is the distance measured in the second direction y of the printing orifice from the locus.

23. The printing stencil of claim 22 wherein the substrate changes dimensions anisitropically during processing and $n_x$ is different from $n_y$.

24. The printing stencil of claim 22 wherein $n_y=0$.

25. The printing stencil of claim 19 further comprising at least one non-printing orifice in the stencil body.

26. The printing stencil of claim 25 wherein the non-printing orifice comprises a registration hole for receiving a registration pin.

27. The printing stencil of claim 19 wherein the stencil body comprises a metal foil.

28. The printing stencil of claim 19 wherein the terminals of the substrate are initially applied in an initial array and the substrate is dimensionally altered to reposition the terminals in the terminal array, each of the solder orifices of the stencil being displaced by a predetermined offset from a position corresponding to a position of an associated terminal in the initial array, the offset for each solder orifice being proportional to a distance of the solder orifice from the center of the stencil body.

29. A printing stencil adapted for registration with an electronic substrate, the electronic substrate bearing an array of terminals, the terminals in the array having an initial relative orientation in an initial terminal army, the stencil comprising:
a stencil body and an array of printing orifices passing through a thickness of the stencil body, each of the printing orifices being displaced by a predetermined offset from a center of the stencil body, the offset for each printing orifice being proportional to a distance of the printing orifice from the center.

30. The printing stencil of claim 29 further comprising at least one non-printing orifice in the stencil body.

31. The printing stencil of claim 30 wherein the non-printing orifice comprises a registration hole for receiving a registration pin.

32. The printing stencil of claim 29 wherein the stencil body comprises a metal foil.

33. The printing stencil of claim 29 wherein the locus comprises a center of the stencil body.

34. The printing stencil of claim 29 wherein printing a central one of the printing orifices encompasses the center of the stencil body, the predetermined offset for the central printing orifice being zero, whereby the position of the central orifice corresponds directly to the position of a corresponding central target in the initial target array.

35. The printing stencil of claim 29 wherein the printing orifices have varying sizes, with the size of each printing orifice being correlated to the distance of the printing orifice from the center.

36. A printing stencil for use with a substrate which carries a plurality of terminals having a predetermined size, the terminals being initially arranged on the substrate in an initial terminal array, the stencil comprising:
a stencil body, a locus, and plurality of printing orifices in the stencil body, the size of each printing orifice being correlated to a first size by a size scaling factor and the position of each printing orifice being displaced by a predetermined offset from a position corresponding to a position of an associated terminal in the initial terminal array, the size scaling factor and the magnitude of the predetermined offset for each printing orifice being proportional to a distance of the printing from the locus.

37. The printing stencil of claim 36 wherein the size scaling factor and the magnitude of the predetermined offset are each linearly proportional to the distance of the printing orifice from the locus.

38. The printing stencil of claim 36 wherein the size scaling factor changes linearly with the distance from the locus.

39. The printing stencil of claim 36 wherein the size scaling factor increases linearly with the distance from the locus.

40. The printing stencil of claim 36 wherein the size scaling factor increases non-linearly with the distance from the locus.

41. The printing stencil of claim 36 wherein the size scaling factor is one at the locus, such that an orifice centered about the locus has the first size, and the size scaling factor changes linearly with the distance from the locus.

42. The printing stencil of claim 41 wherein the size scaling factor increases linearly with the distance from the locus.

43. The printing stencil of claim 36 wherein the magnitude of the predetermined offset increases linearly with the distance from the locus.

44. A subassembly for manufacturing an electronic device, comprising:
   an electronic substrate having a first surface, a substrate locus, circuitry, and a plurality of terminals carried on the first surface and electrically coupled to the circuitry, the terminals having moved with respect to one another from an initial terminal array in which the terminals had a first relative position to a stenciling array in which the terminals have a second relative position; and
   a stencil having a second surface, a stencil locus, and a plurality of solder orifices extending through a thickness of the stencil, each of the solder orifices being displaced by a predetermined offset from a position corresponding to a position of an associated terminal in the initial terminal array, the offset for each solder orifice being proportional to a distance of the solder orifice from the stencil locus;
   the second surface of the stencil being juxtaposed with the first surface of the substrate, the stencil locus being registered with the substrate locus.

45. The subassembly of claim 44 further comprising at least one non-printing orifice in the stencil body.

46. The subassembly of claim 44 wherein the stencil comprises a metal foil.

47. The subassembly of claim 44 wherein the stencil locus comprises a center of the stencil body.

48. The subassembly of claim 47 wherein a central one of the printing orifices is centered on the center of the stencil body, the predetermined offset for the central printing orifice being zero, whereby the position of the central orifice corresponds directly to the position of a corresponding central terminal in the initial terminal array.

49. The subassembly of claim 44 wherein the substrate locus comprises a location equidistant from a plurality of fiducial marks carried by the substrate.

50. A method of applying solder paste on an electronic substrate using a stencil, comprising:
   providing an electronic substrate comprising a substrate body and a plurality of terminals, the substrate body having circuitry, a first surface and a substrate locus, the terminals being electrically coupled to the circuitry and being carried on the first surface in an altered relative relationship which differs from an initial relative relationship in an initial terminal array;
   providing a stencil having a stencil body, a second surface, a stencil locus, and a plurality of solder orifices passing through the stencil body, each solder orifice having a size correlated to an ideal size by a size scaling factor and the position of each solder orifice being displaced by a predetermined offset from a position, corresponding to a position of an associated terminal in the initial terminal array, the size scaling factor and the position scaling factor being proportional to a distance from the stencil locus;
   juxtaposing the first and second surfaces with the stencil locus in registry with the substrate locus; and
   passing a solder paste through the solder orifices to deposit a discrete volume of solder paste on each corresponding terminal.

51. The method of claim 50 wherein the volume of solder delivered through each of the solder orifices is proportional to the size of the orifice, the volume of solder paste delivered through orifices closer to the stencil locus being less than the volume of solder paste delivered through orifices farther from the stencil locus.

52. The method of claim 50 wherein the stencil further comprises an outer face oriented away from the substrate, the solder being passed through the solder orifices by drawing a squeegee across the outer face of the stencil, the size of each orifice and a thickness of the stencil body determining the volume of solder paste delivered through the orifice.

53. A method of applying solder paste on an electronic substrate using a stencil, comprising:
   providing an electronic substrate comprising a substrate body and a plurality of terminals, the substrate body having circuitry, a first surface and a substrate locus, the terminals being electrically coupled to the circuitry and being carried on the first surface in a predetermined relative relationship to define an initial terminal array;
   dimensionally altering the substrate body such that the relative relationship of the terminals differs from the predetermined relative relationship;
   providing a stencil having a stencil body, a second surface, a stencil locus, and a plurality of solder orifices passing through the stencil body, each solder orifice having a size correlated to an ideal size by a size scaling factor and the position of each solder orifice being displaced by a predetermined offset from a position corresponding to a position of an associated terminal in the initial terminal array, the size scaling factor and the position scaling factor being proportional to a distance from the stencil locus;
   Juxtaposing the first and second surfaces with the stencil locus in registry with the substrate locus; and
   passing a solder paste through the solder orifices to deposit a discrete volume of solder paste on each corresponding terminal.

54. A method of designing a stencil for applying solder paste on an electronic substrate, comprising:
   determining initial positions of a plurality of electrically conductive terminals in an initial terminal array to be carried by the substrate;
   estimating a size scaling constant to reflect changes in positions of the terminals from their initial positions in light of anticipated handling of the substrate prior to solder deposition;
   identifying a stencil locus of the stencil;
   arranging a plurality of solder orifices, with a separate solder orifice corresponding to each terminal;
   selecting an initial solder orifice size to deliver an appropriate volume of solder paste to an underlying terminal; and
   sizing each solder orifice by multiplying the initial solder orifice size by a size scaling factor proportional to the size scaling constant, the size scaling factor being 1 at the stencil locus and changing outwardly therefrom in proportion to a distance of the solder orifice from the stencil locus.

55. The method of claim 54 wherein the size scaling constant is estimated by handling a plurality of electronic substrates similar to the substrates with which the stencil will be used according to the anticipated handling and measuring variations in positions of the terminals from their initial positions.

56. The method of claim 54 wherein the size scaling factor is estimated based on known behavior of the material of which the substrate is formed.

57. The method of claim 54 wherein a center of the stencil is identified as the stencil locus.

58. The method of claim 54 wherein the size of each orifice may be calculated according to the formula $S=S_0(1+nd)$, wherein S is the size of the orifice, $S_0$ is the initial solder orifice size, n is the size scaling constant and d is the distance of the solder orifice from the stencil locus.

59. The method of claim 54 wherein the size of each orifice is equal to a size S determined according to the formula $S=S_0(1+n_x d_x)$, wherein $S_0$ is an initial printing orifice size, $n_x$ is a directional size scaling constant related to a first direction x, and $d_x$ is the distance measured in the first direction x of the printing orifice from the locus.

60. The method of claim 54 wherein the size of each orifice is equal to a size S determined according to the formula $S=S_0(1+n_x d_x+n_y d_y)$, wherein $S_0$ is an initial printing orifice size, $n_x$ is a first directional size scaling constant related to a first direction x, $n_y$ is a second directional size scaling constant related to a second direction y, $d_x$ is the distance measured in the first direction x of the printing orifice from the locus and $d_y$ is the distance measured in the second direction y of the printing orifice from the locus.

61. A method of designing a stencil for applying solder paste on a plurality of like electronic substrates, comprising:
determining initial positions of a plurality of electrically conductive terminals in an initial terminal array to be carried by the substrates;
determining a position scaling constant and a size scaling constant to reflect changes in positions of the terminals from their initial positions in light of anticipated handling of the substrates prior to solder deposition;
identifying a stencil locus of the stencil;
arranging a plurality of solder orifices for the stencil, with a separate solder orifice corresponding to each terminal, by displacing each solder orifice from an ideal position by a predetermined offset correlated to the position scaling constant, the ideal position for each solder orifice corresponding to a position of an associated target in the initial target array, the offset for each solder orifice being proportional to a distance of the ideal position of the solder orifice from the stencil locus;
selecting an initial solder orifice size to deliver an appropriate volume of solder paste to an underlying terminal; and
sizing each solder orifice by multiplying the initial solder orifice size by a size scaling factor proportional to the size scaling constant, the size scaling factor being 1 at the stencil locus and changing outwardly therefrom in proportion to a distance of the orifice from the stencil locus.

62. The method of claim 61 wherein the size scaling constant is estimated by handling a plurality of electronic substrates similar to the substrates with which the stencil will be used according to the anticipated handling and measuring variations in positions of the terminals from their initial positions.

63. The method of claim 61 wherein the size scaling factor is estimated based on known behavior of the material of which the substrate is formed.

64. The method of claim 61 wherein a center of the stencil is identified as the stencil locus.

65. The method of claim 61 wherein the size of each orifice is equal to a size S determined according to the formula $S=S_0(1+nd)$, wherein $S_0$ is the initial solder orifice size, n is the size scaling constant and d is the distance of the solder orifice from the stencil locus.

66. The method of claim 65 wherein the position of each orifice is equal to a position P determined according to the formula $P=P_0+md$, wherein $P_0$ is the ideal position of the orifice, m is the position scaling constant, and d is a vector extending from the stencil locus to $P_0$.

67. The method of claim 61 wherein the size of each orifice is equal to a size S determined according to the formula $S=S_0(1+n_x d_x+n_y d_y)$, wherein $S_0$ is an initial printing orifice size, $n_x$ is a first directional size scaling constant related to a first direction x, $n_y$ is a second directional size scaling constant related to a second direction y, $d_x$ is the distance measured in the first direction x of the printing orifice from the locus and $d_y$ is the distance measured in the second direction y of the printing orifice from the locus.

68. The method of claim 67 wherein $n_y=0$.

69. The method of claim 61 wherein the position of each orifice is equal to a position P determined according to the formula $P=P_0+md$, wherein $P_0$ is the ideal position of the orifice, m is the position scaling constant, and d is a vector extending from the stencil locus to $P_0$.

70. The method of claim 61 wherein the position of each orifice is equal to a position P determined according to the formula $P=P_0+m_x d_x+m_y d_y$, wherein $P_0$ is the ideal position of the orifice, $m_x$ is a first directional position scaling constant related to a first direction x, $m_y$ is a second directional position scaling constant related to a second direction y, d is a vector extending from the stencil locus to $P_0$, $d_x$ is a first vector component of the vector d along the first direction x, and $d_y$ is a second vector component of the vector d along the second direction y.

71. A computer readable storage medium containing a computer readable code for operating a computer to perform a method of designing a stencil for applying solder paste on an electronic substrate, the method comprising:
determining initial positions of a plurality of electrically conductive terminals in an initial terminal array to be carried by the substrates;
estimating a size scaling constant to reflect changes in positions of the terminals from their initial positions in light of anticipated handling of the substrates prior to solder deposition;
identifying a stencil locus of the stencil;
arranging a plurality of solder orifices for the stencil, with a separate solder orifice corresponding to each terminal;
selecting an initial solder orifice size to deliver an appropriate volume of solder paste to an underlying terminal; and
sizing each solder orifice by multiplying the initial solder orifice size by a size scaling factor proportional to the size scaling constant, the size scaling factor being 1 at the stencil locus and changing outwardly therefrom in proportion to a distance of the solder orifice from the stencil locus.

72. The storage medium of claim 71 wherein the size scaling constant is estimated by handling a plurality of electronic substrates similar to the substrates with which the stencil will be used according to the anticipated handling and measuring variations in positions of the terminals from their initial positions.

73. The storage medium of claim 71 wherein the size scaling factor is estimated based on known behavior of the material of which the substrate is formed.

74. The storage medium of claim 71 wherein a center of the stencil is identified as the stencil locus.

75. The storage medium of claim 71 wherein the size of each orifice may be calculated according to the formula $S=S_0(1+nd)$, wherein S is the size of the orifice, $S_0$ is the initial solder orifice size, n is the size scaling constant and d is the distance of the solder orifice from the stencil locus.

76. A system for designing a stencil for applying solder paste on a plurality of like electronic substrates, the system comprising:

a memory circuit;

a computer readable storage medium containing program instructions for execution by a processor; and a processor connected to the memory circuit and the computer readable storage medium, the processor executing the program instructions stored on the computer readable medium to:

determine initial positions of a plurality of electrically conductive terminals in an initial terminal array to be carried by the substrates;

estimate a size scaling constant to reflect changes in positions of the terminals from their initial positions in light of anticipated handling of the substrates prior to solder deposition;

determine a stencil locus of the stencil;

arrange a plurality of solder orifices for the stencil, with a separate solder orifice corresponding to each terminal;

select an initial solder orifice size to deliver an appropriate volume of solder paste to an underlying terminal; and size each solder orifice by multiplying the Initial solder orifice size by a size scaling factor proportional to the size scaling constant, the size scaling factor being 1 at the stencil locus and changing outwardly therefrom in proportion to a distance of the orifice from the stencil locus.

77. The system of claim 76 wherein the size scaling constant is estimated by handling a plurality of electronic substrates similar to the substrates with which the stencil will be used according to the anticipated handling and measuring variations in positions of the terminals from their initial positions.

78. The system of claim 76 wherein the size scaling factor is estimated based on known behavior of the material of which the substrate is formed.

79. The system of claim 76 wherein a center of the stencil is identified as the stencil locus.

80. The system of claim 76 wherein the size of each orifice may be calculated according to the formula $S=S_0(1+nd)$, wherein S is the size of the orifice, $S_0$ is the initial solder orifice size, n is the size scaling constant and d is the distance of the solder orifice from the stencil locus.

* * * * *

UNITED STATES PATENT AND TRADEMARK OFFICE
CERTIFICATE OF CORRECTION

PATENT NO. : 6,766,736 B2
DATED : July 27, 2004
INVENTOR(S) : Richard Regner et al.

It is certified that error appears in the above-identified patent and that said Letters Patent is hereby corrected as shown below:

Column 20,
Line 4, "army" should be -- array --;
Line 21, "wherein printing a central" should be -- wherein a central --;

Column 22,
Line 30, "Juxtaposing" should be -- juxtaposing --;

Column 26,
Line 1, "Initial" should be -- initial --.

Signed and Sealed this

Twenty-third Day of August, 2005

JON W. DUDAS
*Director of the United States Patent and Trademark Office*